(12) United States Patent
Riggs et al.

(10) Patent No.: US 8,254,420 B2
(45) Date of Patent: Aug. 28, 2012

(54) ADVANCED LASER WAVELENGTH CONTROL

(75) Inventors: Daniel J. Riggs, San Diego, CA (US); Olav Haugan, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 335 days.

(21) Appl. No.: 12/620,967

(22) Filed: Nov. 18, 2009

(65) Prior Publication Data

US 2011/0116522 A1 May 19, 2011

(51) Int. Cl.
*H01S 3/10* (2006.01)
(52) U.S. Cl. ......... 372/29.02; 372/20; 372/19; 372/32; 372/38.01; 372/101; 372/107; 372/98; 372/99; 372/100; 372/55; 372/57
(58) Field of Classification Search .............. 372/32, 372/19, 55–65, 98–101, 102, 107, 20, 38.01
See application file for complete search history.

(56) References Cited

U.S. PATENT DOCUMENTS

| | | | |
|---|---|---|---|
| 6,192,064 B1 | 2/2001 | Algots et al. | |
| 6,563,128 B2 | 5/2003 | Lublin et al. | |
| 6,614,828 B1 | 9/2003 | Basting et al. | |
| 2003/0012234 A1* | 1/2003 | Watson et al. | 372/25 |
| 2003/0091087 A1 | 5/2003 | Ershov et al. | |
| 2007/0058685 A1* | 3/2007 | O'Daniel et al. | 372/32 |
| 2008/0198891 A1* | 8/2008 | Hori et al. | 372/61 |
| 2008/0232408 A1 | 9/2008 | O'Brien et al. | |
| 2009/0122825 A1 | 5/2009 | Ershov et al. | |
| 2010/0108913 A1* | 5/2010 | Ershov et al. | 250/492.1 |
| 2011/0194580 A1* | 8/2011 | Algots et al. | 372/55 |

FOREIGN PATENT DOCUMENTS

JP  2008/171961 A1  7/2008

OTHER PUBLICATIONS

Merriam Wbster web side, Definition of Predict, Apr. 5, 2012.*
Merriam Wbster web side, Definition of prediction, Apr. 5, 2012.*
Merriam Wbster web side, Definition of predicting, Apr. 5, 2012.*
Daniel Riggs, "Rejection of Aliased Disturbances in a Pulsed Light Source," Proceedings of the 48th IEEE Conference on Decision and Control, Dec. 15-18, 2009, pp. 8148-8153, Shanghai, China.
B.A. Francis and W.M. Wonham, "The Internal Model Principle for Multivariate Regulators," Appl. Math Optimization, vol. 2, 1975, pp. 170-194.
A.H. Jazwinski, "Stochastic Processes and Filtering Theory," Academic Press, 1970, San Diego, CA.
Unknown, "Kalman Filter", in Wikipedia (http://web.archive.org/web/20081227062855/http://en.wikipedia.org/wiki/Kalman_filter), archived Dec. 27, 2008, pp. 1-18.

* cited by examiner

*Primary Examiner* — Tod T Van Roy
*Assistant Examiner* — Delma Forde
(74) *Attorney, Agent, or Firm* — Gard & Kaslow LLP

(57) ABSTRACT

Laser light wavelength control is provided by periodically predicting a next position of a light controlling prism using a model of the prism's motion characteristics. The prediction is then updated if a measurement of laser output wavelength is obtained. However, because the predictions are made without waiting for a measurement, they can be made more frequently than the laser firing repetition rate and the prism can be repositioned at discrete points in time which can occur more frequently than the laser firing events. This also reduces performance degradation which may be caused by being one pulse behind a laser measurement and the resultant laser control signal being applied.

13 Claims, 9 Drawing Sheets

ADVANCED LASER WAVELENGTH CONTROL

BACKGROUND

1. Field of the Invention

The disclosed subject matter is in the field of laser light control and more specifically in the field of controlling the wavelength of a laser light source as may be used in semiconductor photolithography processes.

2. Related Art

Photolithography is a commonly used process in the semiconductor industry. Modern photolithography typically uses a laser light source to provide very narrow band light pulses which illuminate a mask thus exposing photo-resistive material on silicon wafers. However, advances in semiconductor device parameters have put increasing demands on the performance characteristics of the laser light sources used. Improvements in precision and speed of operation are increasingly needed.

Referring now to FIG. 1, a block diagram of a laser system 100 as may be used in a modern photolithography process can be seen. The source of the light in laser system 100 is a master oscillator (MO) chamber 120.

As is known, when MO chamber 120 fires the resulting light enters Line Narrowing Module (LNM) 110 where it shines through a prism (actually several prisms) and onto a grating within LNM 110. This acts as a light wavelength selector in that changing the position of the prism in LNM 110 changes the wavelength of the laser light. This changed wavelength laser light passes back through MO chamber 120 to an output coupler (OC) 130 and then on to, for example, a stepper-scanner device (not shown) which is responsible for handling and exposing the semiconductor wafers.

Output coupler 130 also passes the laser light output from MO chamber 120 to a Line-center Analysis Module (LAM) 170. LAM 170 is a wavelength sampler which measures the wavelength of the light output from MO chamber 120. The laser light output measurement is then passed from LAM 170 to control computer 160.

Control computer 160 uses the light output measurement to determine what changes need to be made to reposition the prism in LNM 110 to achieve the desired laser light output wavelength for the next laser firing event. The position of the prism in LNM 110 is controlled by a voltage applied to a piezoelectronic transducer (PZT) 140 connected to the prism in LNM 110. Control computer 160 therefore determines what voltage should be applied to PZT 140 to achieve the new desired prism position.

Control computer 160 outputs to PZT drive electronics 150 a digital signal indicating the desired voltage change to be made to the prism in LNM 110. PZT drive electronics comprise a digital-to-analog converter (DAC) that converts the control computer 160 digital signal to an analog voltage signal and an analog low pass filter which reduces high-frequency electrical noise and amplifies the analog DAC voltage signal. This analog voltage signal is then passed from PZT drive electronics 150 to PZT 140 which repositions the prism in LNM 110 which in turn causes a change in the wavelength of the light output from MO chamber 120 through output coupler 130 at the next laser firing event.

This process continues as the stepper-scanner requests a further sequence or burst of light pulses from the laser system at a specified pulse rate, start time and wavelength.

Various challenges have arisen as the photolithography process has advanced over the years. For example, the reduction in semiconductor feature size has caused a reduction in the desired wavelength of the laser light source to maintain the desired focus. Reducing the wavelength requires ever greater precision in the output laser light.

A further challenge is created by pulse periods which vary from 167 to 600 microseconds. At high pulse rates, very little time is available for LAM 170 to take a measurement, pass it to control computer 160, for control computer 160 to calculate a new voltage value for the prism in LNM 110, pass it to PZT drive electronics 150, for PZT drive electronics 150 to analog convert and filter the new voltage value, pass it to PZT 140 and for PZT 140 to change the prism position in order to change the wavelength of light from MO chamber 120 before the next laser light pulse is to occur.

Referring now to FIG. 2, a timing diagram of the above sequence can be seen. Two laser firing events from a sequence of such pulses in a burst are shown, the first indicated as occurring at time $t_0$ and the second indicated as occurring at time $t_3$. After the first laser firing event at time to, the resulting output wavelength is measured by LAM 170 (referring again to FIG. 1). The delay in LAM 170 processing to measure the output wavelength and provide it to control computer 160 is shown in the figure as the LAM delay from time to $t_0$ time $t_1$. The time at which a new control signal is then applied to the prism in LNM 110 is shown as time $t_2$. The delay between time $t_1$ and $t_2$ is the time taken by control computer 160 to calculate a new voltage and have that new voltage be propagated through PZT drive electronics 150 to PZT 140 to reposition the prism before the laser fires at $t_3$.

The LAM 170 measurement delay is fairly fixed in that it depends upon LAM 170 processing time and transmission time from LAM 170 to control computer 160. However, the laser firing rate (the time between $t_0$ and $t_3$) is dictated by the stepper-scanner. Ultimately, with a faster laser firing rate, the LAM 170 measuring delay could potentially be long enough such that a subsequent laser firing event might occur before a new control signal is applied. If that were to occur then there would be a performance hit because the new control signal would then be based on a measurement from an earlier laser firing event rather than on the most recent laser firing event (i.e., it would be one pulse behind). What is needed, therefore, is an improved laser control which can operate with ever-increasing laser firing rates.

A further problem with known approaches to laser control are various disturbances in laser system 100 which make it more difficult to precisely determine how to position the prism in LNM 110. What is additionally needed, therefore, is an improved laser control which can address the various disturbances that occur in a laser system.

SUMMARY

An advanced system and method for controlling the wavelength of a laser without dependency on receiving a laser light measurement before repositioning the prism is shown and described herein with reference to a number of specific embodiments.

In one embodiment is a method of laser wavelength control comprising making a prediction at first discrete intervals of the position of a prism in a laser system, receiving at second discrete intervals a measurement of an output wavelength of a master oscillator chamber in the laser system, the second regular intervals being longer than the first regular intervals, wherein during each first discrete interval if the output wavelength measurement has not been received during the first discrete interval then computing in a control computer a control voltage for the prism using the predicted position of the prism, if the output wavelength measurement has been received during the first discrete interval then updating the predicted position of the prism using the output wavelength measurement and computing in the control computer a control voltage for the prism using the updated predicted position of the prism, and outputting the computed control voltage from the control computer to electronics for positioning the prism.

In another embodiment is a method of laser wavelength control comprising making a prediction at first discrete intervals of the position of a prism in a laser system, receiving at second discrete intervals a measurement of an output wavelength of a master oscillator chamber in the laser system, the second regular intervals being longer than the first regular intervals, wherein during each first discrete interval if the output wavelength measurement has not been received during the first discrete interval then computing in a control computer a control voltage for the prism using the predicted position of the prism, if the output wavelength measurement has been received during the first discrete interval then, if the laser has fired again since receiving the output wavelength measurement then updating a previous prism position prediction using the output wavelength measurement, making a new of prism position prediction based on the updated previous prism position prediction and computing in the control computer the control voltage for the prism using the new prism position prediction, and if the laser has not fired again since receiving the output wavelength measurement then updating the predicted position of the prism using the output wavelength measurement and computing in the control computer the control voltage for the prism using the updated prism position prediction, and outputting the computed control voltage from the control computer to electronics for positioning the prism.

In still another embodiment is a prism controller method comprising predicting at first discrete intervals the position of a prism using a prism movement model, receiving at second discrete intervals a measurement of the output wavelength of a master oscillator chamber controlled by the prism, the second regular intervals being longer than the first regular intervals, wherein during each first discrete interval if the output wavelength measurement has not been received during the first discrete interval then computing a control voltage for the prism using the predicted position of the prism, if the output wavelength measurement has been received during the first discrete interval then updating the predicted position of the prism using the output wavelength measurement and computing a control voltage for the prism using the updated predicted position of the prism, and outputting the computed control voltage to electronics for positioning the prism.

BRIEF DESCRIPTION OF THE DRAWING

Various embodiments are disclosed in the following detailed description and the accompanying drawing.

DETAILED DESCRIPTION

What is provided is an advanced system and method for controlling the wavelength of a laser as may be used in semiconductor photolithography. Rather than waiting for a laser light measurement before determining how to reposition a prism in a laser system, this advanced system and method periodically predicts a next position of a prism in the laser system using a model of the prism's motion characteristics and known disturbance behaviors. The periodicity of these predictions is typically more rapid than the periodicity of laser firing events such that the interval between predictions is typically shorter than the interval between laser firing events. This eliminates the prior art dependency on receiving a laser light measurement before repositioning the prism. A measurement of laser output wavelength is still obtained when a laser firing event occurs and is used to update or improve upon the prism position prediction. Whether updated or not, the predicted prism position is used to compute a control signal used to drive a PZT which controls the prism position. In this fashion, predictions are periodically made, control signals are periodically computed, and the prism is periodically repositioned accordingly.

Figure 2:
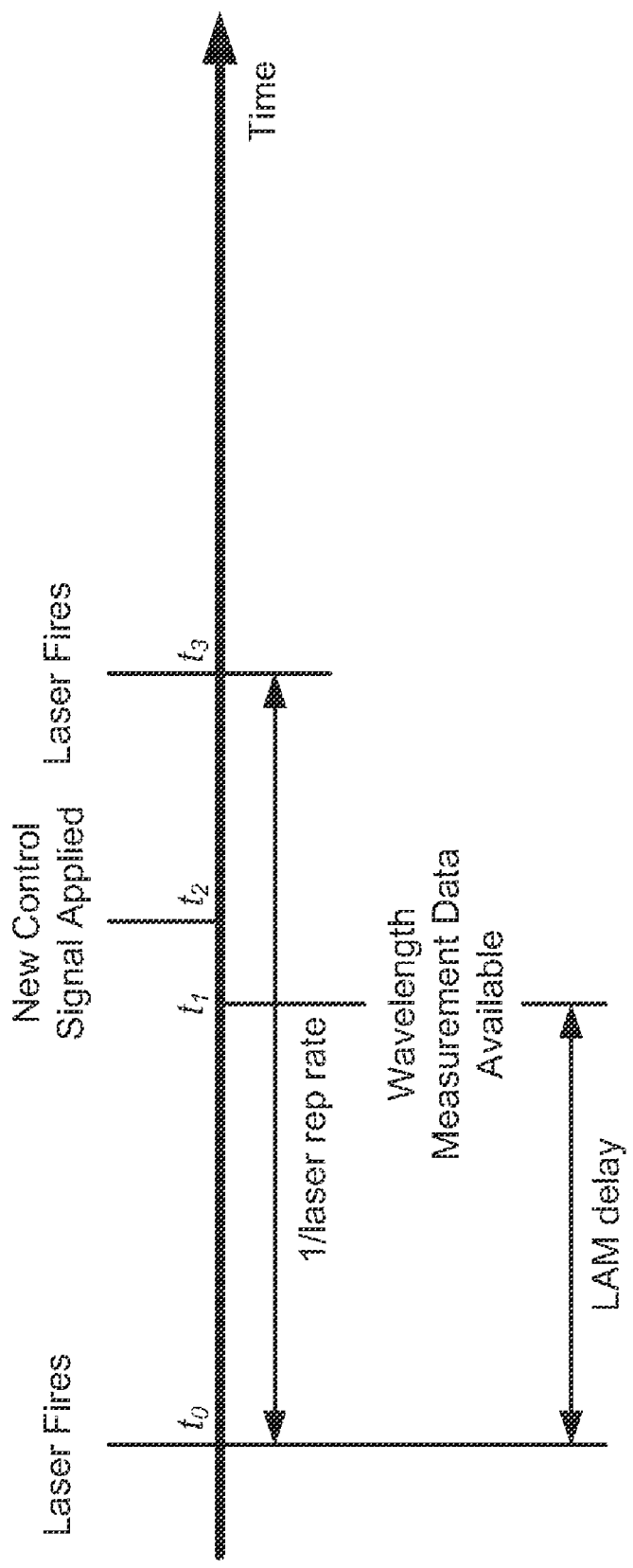
FIG. 2 is a timing diagram illustrating the sequence of events of the prior art.

The advanced laser control system and method described herein can be thought of as a "fast-discrete/slow-discrete filter." Because the predictions of prism position are made without waiting for output wavelength measurements, the predictions can be made more frequently (the so-called "fast-discrete") than the laser firing repetition rate and the resultant output wavelength measurement (the so-called "slow-discrete"). Resultantly, the prism can be repositioned at discrete points in time which can occur more frequently than the laser firing events. Further, this separation of when predictions are made from when laser firing events occur means that frequency of updating prism control is no longer limited by the time it takes to measure laser output wavelength (the "LAM delay" of FIG. 2). This also means reducing performance degradation due to being one pulse behind a laser measurement and the resultant laser control signal application.

Figure 3:
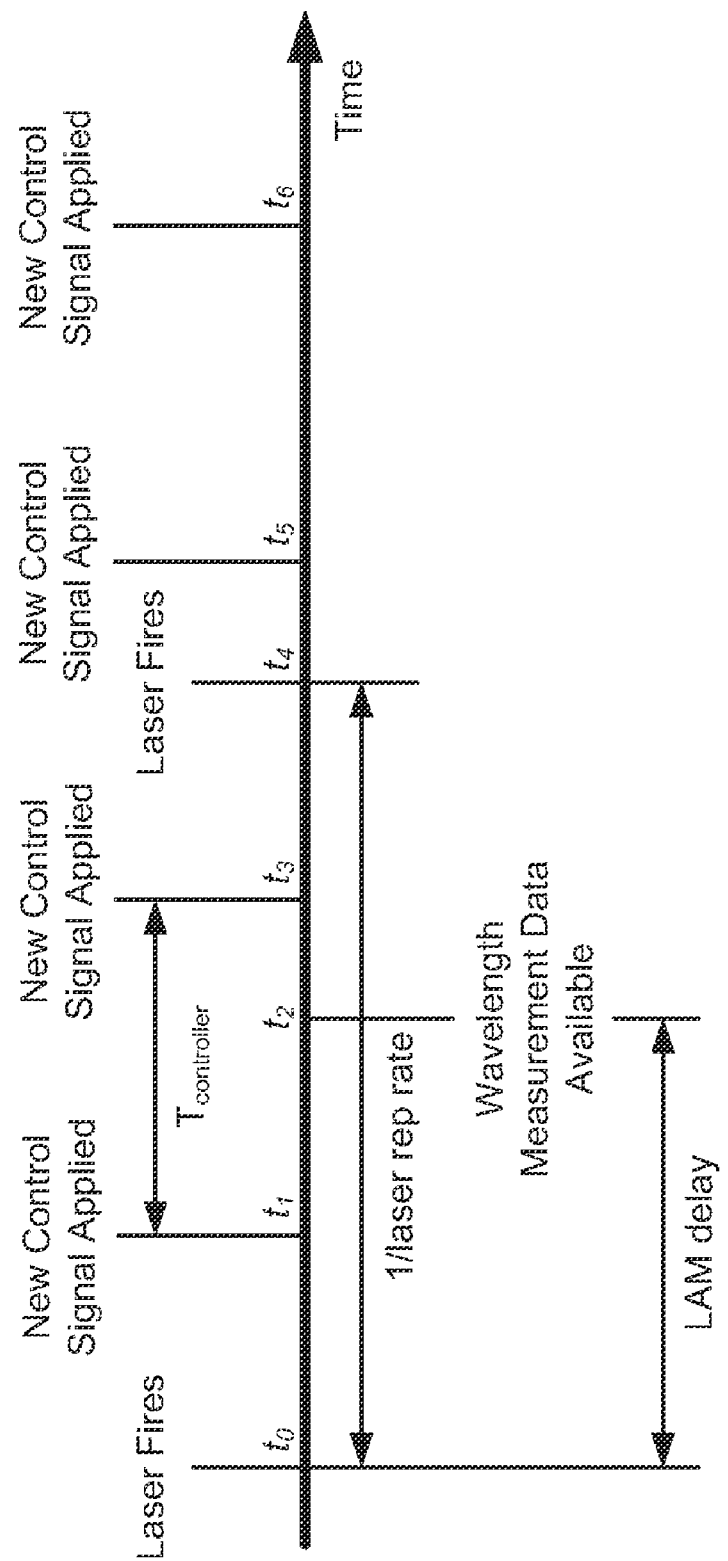
FIG. 3 is a timing diagram illustrating the sequence of events according to an exemplary embodiment.

Referring now to FIG. 3, a timing diagram of the above sequence can be seen. Periodic laser firing events are indicated as occurring at times $t_0$ and $t_4$ and wavelength measurement data is indicated as becoming available at time $t_2$. Additionally, occurring more frequently are new prism control signals being applied as indicated at times $t_1$, $t_3$, $t_5$ and $t_6$ with the interval between prism control signals shown as $T_{controller}$. These prism control signals are the result of new prism predictions being made during each cycle of control signal application. Further, these prism predictions are made without waiting for the wavelength measurement data to become available. However, as stated above, when new wavelength measurement data is available, it is used to update the prism position prediction. As shown, the frequency with which new control signals are applied occurs more rapidly than the frequency of laser firing events. The details, variations and alternatives of these operations are explained further elsewhere herein.

Referring again to FIG. 1, the block diagram of laser system 100 will be used in describing one embodiment of the present apparatus.

Control computer 160 makes periodic predictions of the prism position in LNM 110 using a model of the prism's movement in laser system 100 as explained more fully elsewhere herein. Control computer 160 uses the periodic prism position predictions to periodically output a digital control signal to PZT drive electronics 150 indicating the desired voltage to be applied to the prism in LNM 110. The PZT drive electronics 150 DAC converts the control computer 160 digital signal to an analog voltage signal and the PCT drive electronics 150 analog low pass filter reduces high-frequency electrical noise and amplifies the analog DAC voltage signal. This analog voltage signal is then passed from PZT drive electronics 150 to PZT 140 which is the application of the new control signal. This voltage update event repositions the prism in LNM 110 which subsequently causes a change in the wavelength of the light output from MO chamber 120 through output coupler 130 at the next laser firing event.

As previously explained, the source of the light in laser system 100 is MO chamber 120. When MO chamber 120 fires, the resulting light enters Line Narrowing Module (LNM) 110 where it shines through the prism (actually, multiple prisms as explained more fully elsewhere herein) and onto a grating within LNM 110 which acts as a light wavelength selector. The altered wavelength laser light passes back through MO chamber 120 to output coupler 130 which passes the laser light output from MO chamber 120 to Line-center Analysis Module (LAM) 170. LAM 170 measures the wavelength of the laser light and passes the measurement to control computer 160. When control computer 160 receives the laser light output measurement from LAM 170 control computer 160 uses the measurement to update the predicted prism position as explained more fully elsewhere herein.

This process is periodically repeated for subsequent prism control signal application/voltage signal update cycles as was shown, for example, in FIG. 3. Additionally, should a new wavelength measurement become available, as occurs at time $t_2$ in FIG. 3, control computer 160 will update the predicted prism position using this newly received measured data.

As stated above, control computer 160 makes periodic predictions of the prism position in LNM 110 using a model of the prism's movement in laser system 100. The model of the prism's movement is based on knowledge of various characteristics of the prism's physical movement in laser system 100 and taking into account oscillatory actions of the prism and disturbances within laser system 100. In a preferred embodiment, the model used, in its integral form, is:

$$x(t+T) = e^{AT}x(t) + \int_0^T e^{A\tau} Bu(T-\tau)d\tau \quad\quad (A)$$

Where $x(t+T)$ is the predicted state T-seconds-ahead of the initial state $x(t)$, $e^{AT}$ is the standard state-transition matrix for a linear system, and B is the standard input matrix.

Formula (A) above thus makes a prediction for a future event based on the state or prediction of a past event. For example, referring again to FIG. 3, formula (A) can be used to make a prism position prediction for time $t_6$ based on a previously made prediction for time $t_5$, in which case $T=t_6-t_5$ in formula (A). Note that initial conditions are assumed for initial predictions (e.g., at laser bootup, initial condition is a predefined constant and at the beginning of a sequence of laser pulses the initial condition is the last state from the end of the previous laser pulse sequence plus any interburst operations such as setpoint changes.)

It is also to be understood that the above formula takes into account disturbances of the wavelength in laser system 100. For example, burst transients and steady-state disturbances cause unwanted laser light wavelength variations. Beginning-of-burst transients are typically seen in the measured wavelength which are believed to be caused by shockwaves which are a function of laser chamber acoustics and are known to change with laser firing rate which further complicates matters. These beginning-of-burst transients are modeled as random walk processes. Steady-state disturbances appear as sinusoids in the wavelength signal and are modeled as such. These sinusoidal steady-state disturbances are believed to be caused by a fan, among other vibration sources, in laser system 100. These disturbances, and any others identified in laser system 100, can all be taken into account in the model used for prism position prediction.

As previously stated and explained more fully elsewhere herein, a prism position prediction is then updated when a new laser light measurement is received. Updating the prism position prediction is done via the following formula:

$$x(k|k) = (I - L_k C_k) \times x(k|k-1) + L_k y(k) \quad\quad (B)$$

In the above equation, k indexes the laser firing events.

I is the identity matrix of appropriate size (n rows by n columns, where n is the number of elements in the state vector x)

$L_k$ is a gain matrix that captures the tradeoff between "trusting new data and believing the previous prediction".

$C_k$ is the standard mapping from predicted state to predicted output, e.g. y=Cx.

x(k|k) is the updated prediction, given the latest data at index k x(k|k−1) is the "old" prediction of the state at laser firing index k given data from the previous laser firing event, k−1.

Formula (B) above thus updates a previously made prediction as explained more fully elsewhere herein.

Figure 4:
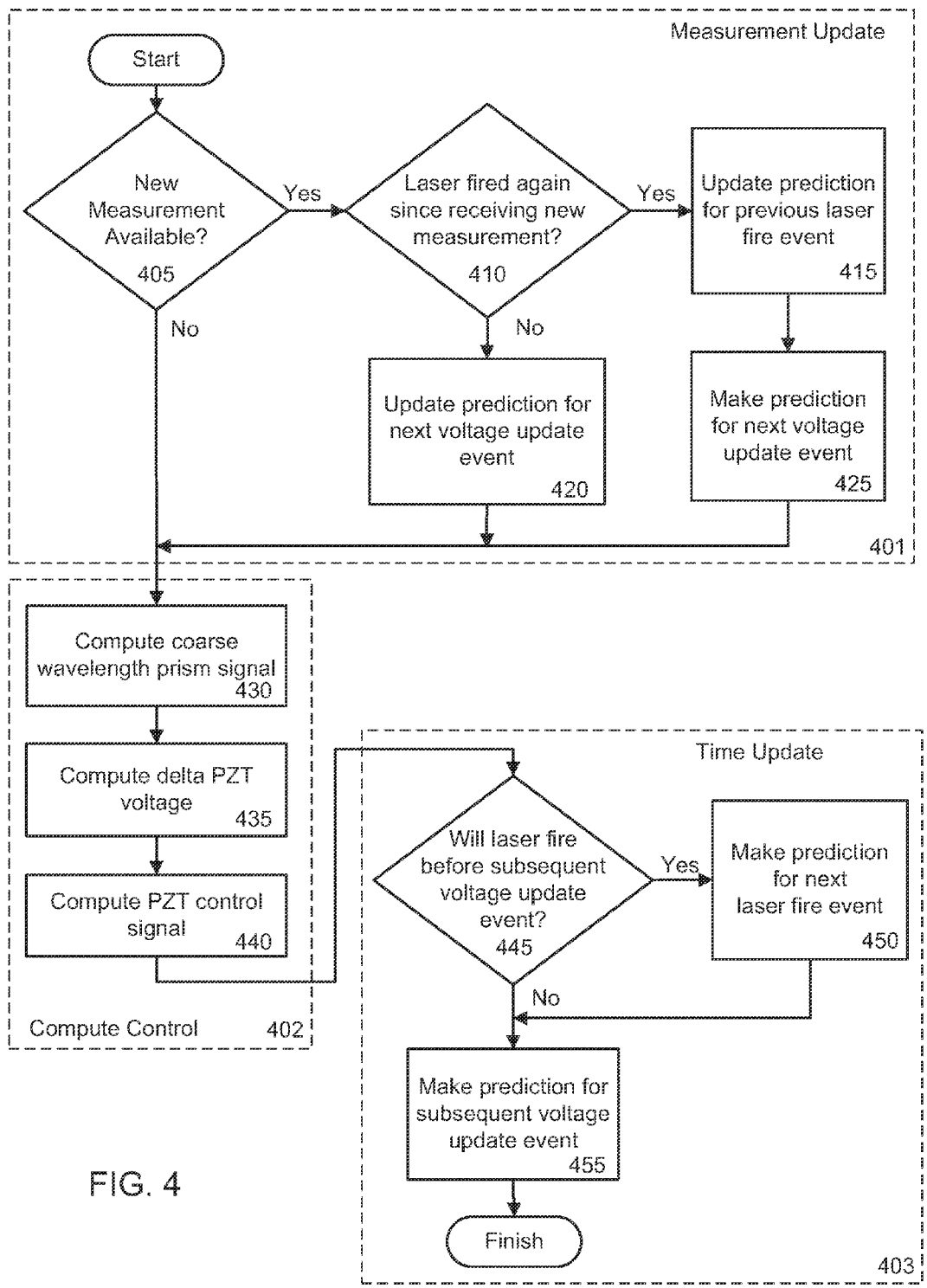
FIG. 4 is a flowchart of one embodiment of the present method.

Referring now to FIG. 4, a flowchart of one embodiment of the present method can be seen. In the figure the method can be seen to be logically divided into three sections although it is to be understood that the functionality described can be implemented in alternative configurations. Measurement update section 401 is directed to the update operations which occur when receiving a new laser light measurement. Compute control section 402 is directed to the operations which occur in computing new control signals using a prism position prediction. Time update section 403 is primarily directed to the operations which occur to make a prediction for a subsequent voltage update event. Each of these, in the context of one embodiment, will now be explained in greater detail.

Figure 1:
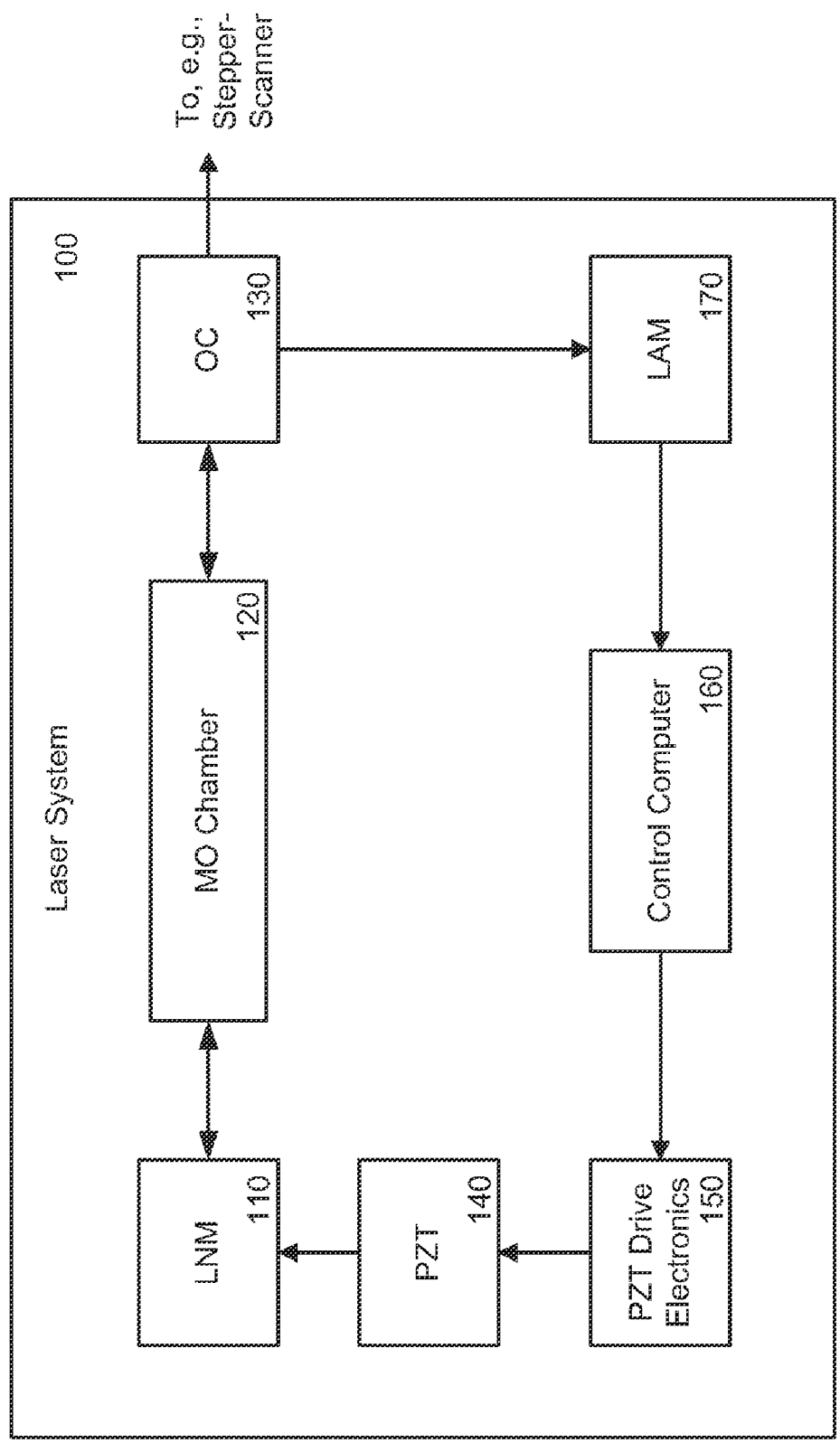
FIG. 1 is a block diagram of an exemplary laser system which may be used in one embodiment.

The process, running for example on control computer 160 of FIG. 1, begins in measurement update section 401 when the process is periodically started by, for example, a timer in control computer 160.

If a new wavelength measurement is not available in decision block 405, the process leaves measurement update section 401 and enters compute control section 402. In compute control section 402 a next prism position prediction, which was previously made, is used in step 430 to compute a value for a coarse wavelength prism in LNM 110. As is known, a typical configuration of LNM 110 comprises more than one prism, one being the coarse wavelength prism which is used to keep the PZT near its mid-range voltage, and another being the prism generally referred to herein which is used for fine wavelength control. Although not shown in FIG. 4, the new value for the coarse wavelength control prism is output from control computer 160 to appropriate drive electronics.

In step 435, the next prism position prediction, which was previously made, is used to compute a delta PZT voltage. The delta or change in PZT voltage is computed according to the following formula:

$$\Delta u(m\tau c) = -Kx(m\tau c) \quad (C)$$

m indexes the control events (i.e., voltage update events)

$\tau c$ is the controller sample period, thus making $x(m\tau c)$ the state at the time of the (upcoming) voltage update K is a state feedback matrix, computed to minimize a weighted sum of control energy and wavelength performance.

This delta PZT voltage is then used in step 440 to compute a new PZT control signal. The new PZT control signal is computed according to the following formula:

$$V(m\tau c) = V((m-1)\tau c) + \Delta u(m\tau c) \quad (D)$$

$V((m-1)\tau c)$ is the PZT control signal from the previous update $\Delta u(m\tau c)$ is the output of equation (C)

$V(m\tau c)$ is the new PZT control signal

Note that when the context is clear, signals such as $V(m\tau c)$ will be denoted as $V_m$ for brevity.

Although not shown in FIG. 4, the PZT control signal is then output to, for example, PZT drive electronics 150 of FIG. 1, to be applied to the prism.

The process continues by leaving compute control section 402 and entering time update section 403 where it is determined in step 445 whether the laser will fire again before a subsequent voltage update event (the subsequent application of a new control signal to the prism) as explained by reference to FIG. 5.

Figure 5:
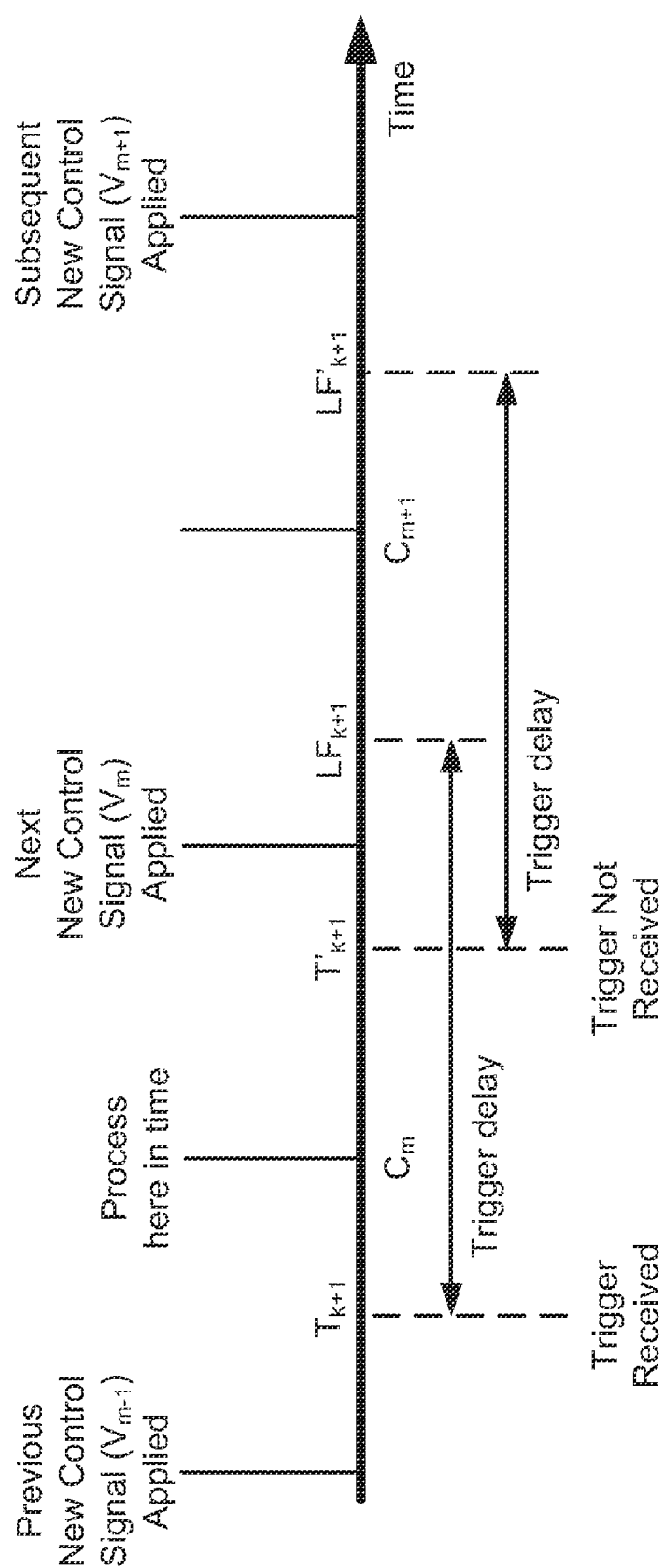
FIG. 5 is a timing diagram illustrating the determination of whether a laser will fire again before a subsequent voltage update event according to one embodiment.

As can be seen in FIG. 5, new control signals denoted in the figure as $V_{m-1}$, $V_m$ and $V_{m+1}$ will be applied periodically. The current process, however, is indicated as being at time $C_m$ and there are two possible scenarios to be considered in which the laser will fire before a subsequent voltage update event.

Before describing these two scenarios, it is to be understood that at this point in time in the process, namely $C_m$, the subsequent voltage update event is the application of a new control signal $V_{m+1}$ rather than the next voltage update event which is the application of a new control signal $V_m$. This distinction between a next voltage update event and a subsequent voltage update event is simply a function of where the periodic process is in its cycle. Likewise, a subsequent voltage update event becomes the next voltage update event of the next cycle.

As already stated, at point in time $C_m$, there are two scenarios where the laser will fire before a subsequent voltage update event. The first scenario is when the laser system has already received a trigger signal from the stepper-scanner system, such as depicted at point in time $T_{k+1}$, in the figure, for MO chamber 120 to fire again. This received trigger signal can then be used in conjunction with a known laser trigger delay (i.e., a known lag between scanner trigger signal and subsequent light generation) to estimate the timing of the resulting laser firing event, shown as $LF_{k+1}$ in the figure, to determine whether the laser firing event will occur before the subsequent voltage update event $V_{m+1}$ (which it would in this example).

The second scenario is when the laser system has not yet received a trigger signal from the stepper-scanner system, as depicted by the trigger being received at a later point in time $T'_{k+1}$ in the figure which is after the current time $C_m$. Not yet having received a trigger signal, the process instead estimates a laser firing event, shown as $LF'_{k+1}$ in the figure, based on one or more previously received periodic trigger signals and the known trigger delay. The process then determines whether this estimated laser firing event $LF'_{k+1}$ will occur before the subsequent voltage update event $V_{m+1}$ (which it would in this example).

The process has now determined whether, under the two possible scenarios, the laser will fire before the subsequent voltage update event $V_{m+1}$.

Referring back to FIG. 4, if the outcome of decision block 445 is that the laser will not fire before a subsequent voltage update event then; in step 455, a prism position prediction is made for the subsequent voltage update event.

Figure 6:
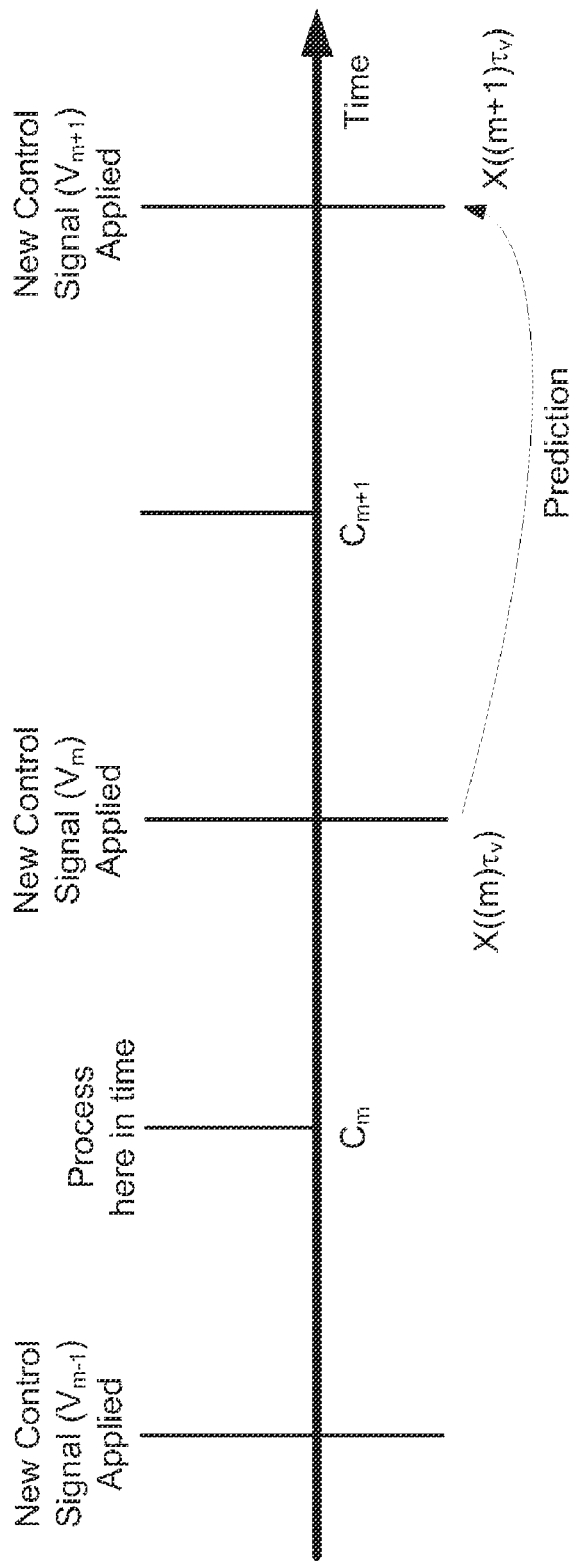
FIG. 6 is a timing diagram illustrating making a prediction for a subsequent voltage update event according to one embodiment.

Making a prism position prediction for the subsequent voltage update event, as done in step 455, will now be explained with reference to FIG. 6. As before, the process is presently at time $C_m$. The prediction being made is for the subsequent voltage update event denoted $V_{m+1}$ and, as indicated by the arrow in the figure, this prediction is based on a previously made prediction for the next voltage update event denoted $V_m$. In the preferred embodiment, the prediction for the subsequent voltage update event is made using formula (A) described elsewhere herein.

Referring back to FIG. 4, the process then finishes one cycle of operation in time update section 403.

It is to be understand that now having made a prediction for a subsequent voltage update event, the sequence of decision block 405 determining that no new measurement is available followed by computing new control signals in steps 430, 435 and 440, and with decision block 445 determining that the laser will not fire before a further subsequent voltage update event, all result in periodic prediction and repositioning of the prism at discrete points in time as was depicted in the timing diagram of FIG. 3.

Returning again to decision block 445, if instead it was determined that the laser will fire before a subsequent voltage update event then, in step 450, a prism position prediction is made for the next laser fire event.

Figure 7:
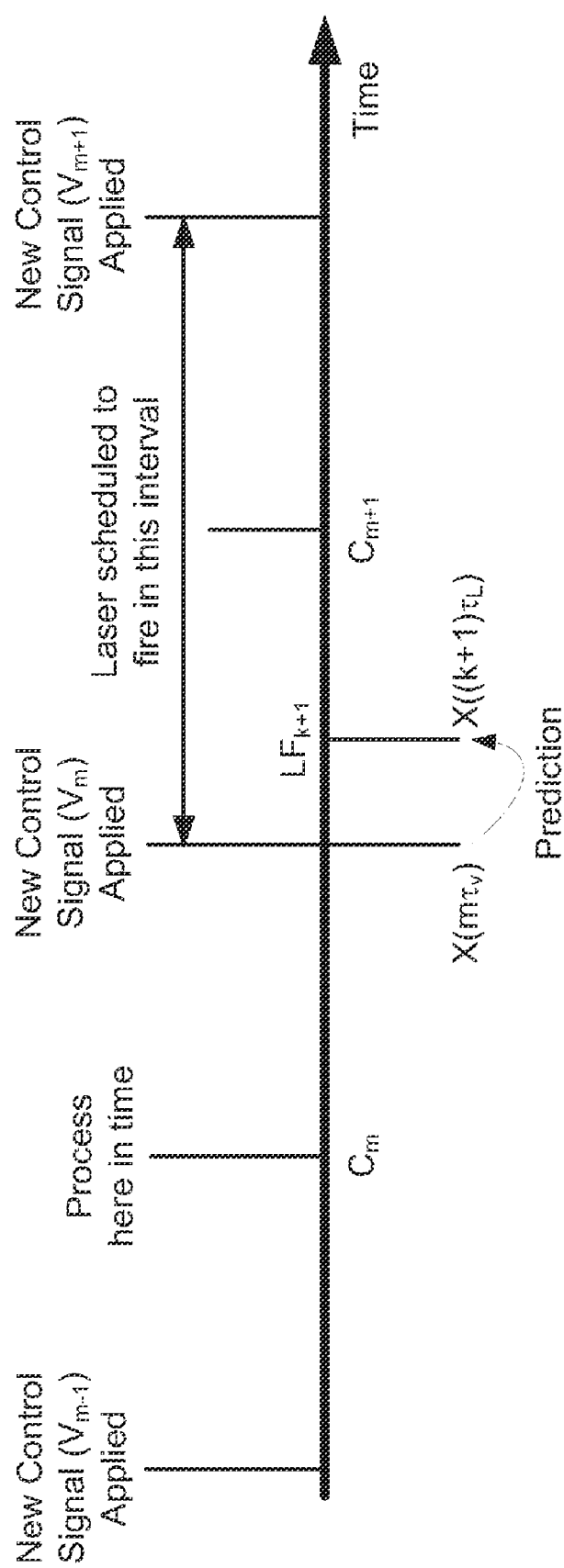
FIG. 7 is a timing diagram illustrating making a prediction for a next laser firing event according to one embodiment.

Making a prism position prediction for the next laser fire event, as done in step 450, will now be described with reference to FIG. 7. As before, the process is presently at time $C_m$. Further, in this example and as was explained with reference to FIG. 5, it is now known that the laser will fire at $LF_{k-1}$ which is after the next voltage control update $V_m$ and before the subsequent voltage control update $V_{m+1}$. The process now makes a prism position prediction for the laser firing event at $LF_{k+1}$, based on a previously made prediction for voltage update event $V_m$, as indicated by the prediction arrow in the figure. In the preferred embodiment, this prediction for the laser firing event at $LF_{k+1}$ is made using formula (A) described elsewhere herein.

Referring back to FIG. 4, the process then proceeds to step 455 where a prism position prediction is made for the subsequent voltage update event as already described. And, as before, the process then finishes one cycle of operation in time update section 403.

Referring again to decision block 405 and the beginning of the periodically started process in measurement update section 401, if instead a new laser output measurement had been received and is therefore available then the process continues within measurement update section 401 by performing one or more updates to previous predictions and/or new prediction using the new measurement as will be explained further.

If it is determined in decision block 410 that the laser has not fired again since the last time a new laser output measurement was received then the process continues to step 420 where the prediction for the next voltage update event is updated with the new measurement.

Figure 8:
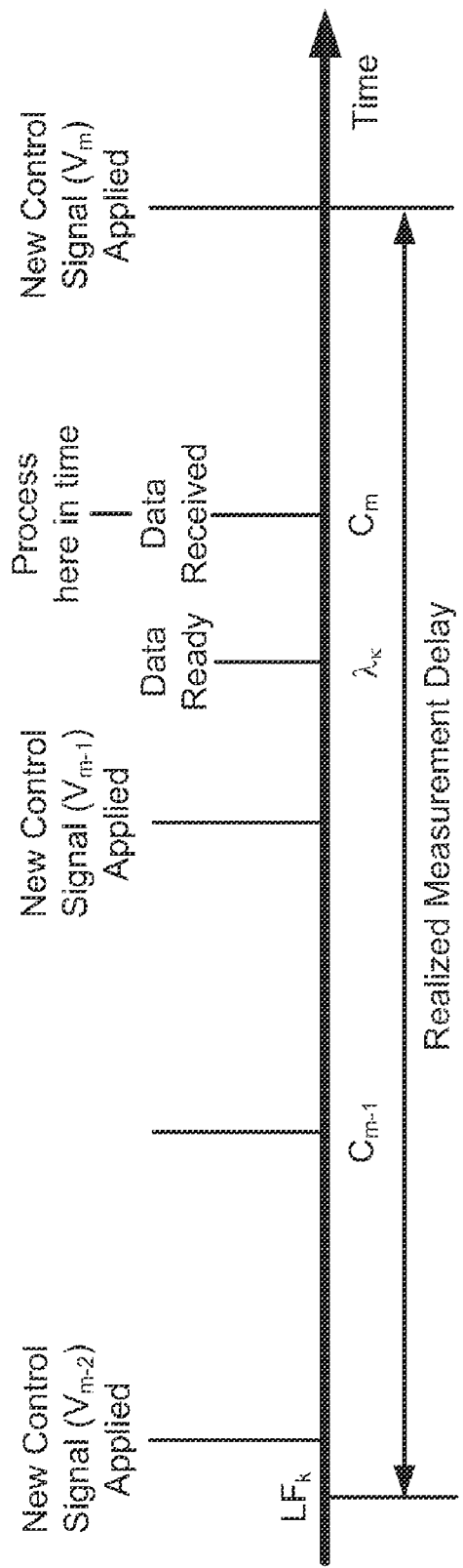
FIG. 8 is a timing diagram illustrating updating a prediction for a next voltage update event with a new laser light measurement according to one embodiment.

Updating the prediction for the next voltage update event with the new measurement, as done in step 420, will now be described with reference to FIG. 8. As before, the process is presently at time $C_m$ and now the laser output measurement for laser firing event $LF_k$ has become available before a prediction to a subsequent voltage control event $V_{m+1}$ (not shown) has been made. The process uses the remaining time before the next control signal $V_m$ is to be applied to update a previously made prediction for that voltage update event using the newly available laser output measurement. In this way, the newly available laser output measurement from laser firing event $LF_k$ is used to update the prediction that was previously made for new control signal application $V_m$. In the preferred embodiment, updating the prediction for the next voltage update event is made using formula (B) described elsewhere herein.

Referring back to FIG. 4, having now updated the previously made prism prediction for the next voltage update event, the process continues, as previously described, by leaving measurement update section 401 and entering compute control section 402 starting with compute coarse wavelength prism signal 430, etc. However, now the computation steps 430, 435 and 440 use the updated prediction for the next voltage update event thus benefitting from the newly received laser output wavelength measurement data.

Alternatively, referring back to decision block 410 of measurement update section 401, if it was determined that the laser had fired again since the last time a new laser output measurement was received then the process continues to step 415 where the prediction for the previous laser firing event is updated with the new measurement and to step 425 where a new prediction for the next voltage update event will be made based on the updated prediction for the previous laser firing event, each as will be explained further.

Figure 9:
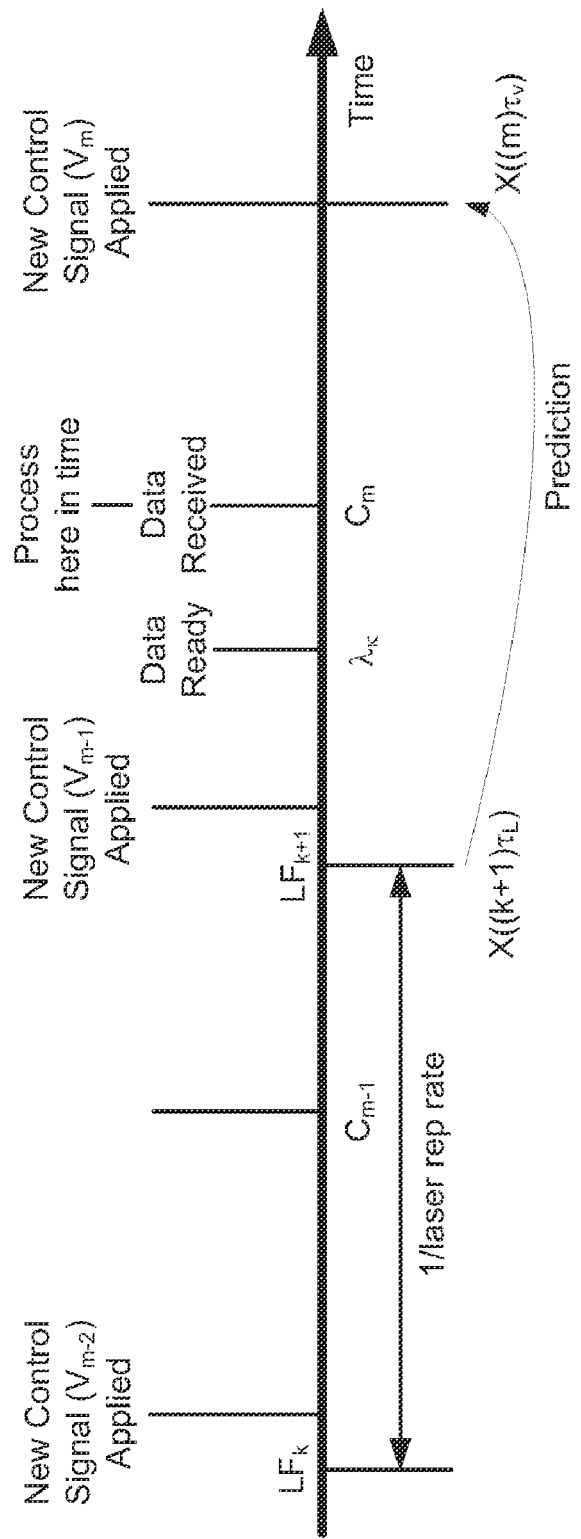
FIG. 9 is a timing diagram illustrating updating a prediction for a previous laser firing event and making a new prediction for a next voltage update event based on the updated prediction for the previous laser firing event according to one embodiment.

Updating the prediction for the previous laser firing event with the new measurement, as done in step 415, will now be explained with reference to FIG. 9. As before, the process is presently at time $C_m$ and now the laser output measurement from laser firing event $LF_k$ has become available. The process updates the previously made prediction for laser firing event $LF_{k+1}$ (as made in step 450, as explained elsewhere herein, in a previous process cycle) using the new laser output measurement from laser firing event $LF_k$. In the preferred embodiment, updating the prediction for the previous laser firing event is made using formula (B) described elsewhere herein.

Making a new prediction for the next voltage update event based on the updated prediction for the previous laser firing event, as done in step 420, will now also be explained with reference to FIG. 9. As before, the process is presently at time $C_m$. The updated prediction for the previous laser firing event $LF_{k+1}$ from step 415 is used to make a prediction for the next voltage update event shown in the figure as new control signal $V_m$ being applied and as indicated by the prediction arrow. In the preferred embodiment, making the new prediction for the next voltage update event based on the updated prediction for the previous laser firing event is made using formula (A) described elsewhere herein.

Referring back to FIG. 4, having now made a new prediction for the next voltage update event, the process continues, as described elsewhere, by leaving measurement update section 401 and entering compute control section 402 starting with compute coarse wavelength prism signal 430, etc. However, now the computation steps 430, 435 and 440 use the newly created prediction for the next voltage update event thus benefitting from the newly received laser output wavelength measurement data and the known timing of the new laser firing event.

Finally, the process cycle concludes by performing the appropriate operations in time update section 403 to make a prediction for a subsequent voltage update event as described elsewhere herein.

To aid in understanding, various different sequences of processing steps reflecting the various scenarios which occur will now be reviewed.

In a first possible sequence, the control signals are computed and output and a prediction for a subsequent voltage event is created. This scenario occurs when there has been no new laser output wavelength measurement and the laser will not fire before the next voltage update event. This sequence comprises processing steps 430, 435, 440 and 455.

In a second possible sequence, the control signals are computed and output, a prediction is made for a next laser fire event and a prediction for a subsequent voltage event is created. This scenario occurs when there has been no new laser output wavelength measurement and the laser will fire before the next voltage update event. This sequence comprises processing steps 430, 435, 440, 450 and 455.

In a third possible sequence, the prediction for the next voltage update event is updated, the control signals are computed based on that updated next voltage update event, and a prediction for a subsequent voltage update event is made. This scenario occurs when a new laser output wavelength measurement has become available, the laser has not fired again since last receiving a new measurement and the laser will not fire before the next voltage update event. This sequence comprises processing steps 420, 430, 435, 440 and 455.

In a fourth possible sequence, the prediction for the next voltage update event is updated, the control signals are computed based on that updated next voltage update event, a prediction for a next laser firing event is made and a prediction for a subsequent voltage update event is made. This scenario occurs when a new laser output wavelength measurement has become available, the laser has not fired again since last receiving a new measurement and the laser will fire before the next voltage update event. This sequence comprises processing steps 420, 430, 435, 440, 450 and 455.

In a fifth possible sequence, the prediction for the previous laser firing event is updated, a prediction for the next voltage update event is made based on the updated previous laser firing event, the control signals are computed based on that prediction for the next voltage update event and a prediction for a subsequent voltage update event is made. This scenario occurs when a new laser output wavelength measurement has become available, the laser has fired again since last receiving a new measurement and the laser will not fire before the next voltage update event. This sequence comprises processing steps 415, 425, 430, 435, 440 and 455.

In a sixth possible sequence, the prediction for the previous laser firing event is updated, a prediction for the next voltage update event is made based on the updated previous laser firing event, the control signals are computed based on that prediction for the next voltage update event, a prediction for a next laser firing event is made and a prediction for a subsequent voltage update event is made. This scenario occurs when a new laser output wavelength measurement has become available, the laser has fired again since last receiving a new measurement and the laser will fire before the next voltage update event. This sequence comprises processing steps 415, 425, 430, 435, 440, 450 and 455.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, the description and the drawing should not be considered in a limiting sense, as it is understood that the present invention is in no way limited to only the embodiments illustrated.

As one possible alternative, it is to be understood that the advanced laser control method and apparatus described herein could be used for control of the bandwidth of the laser light in a similar fashion as described herein for control of the wavelength of the laser light.

It is also to be understood that alternative sequences and mathematical formulas could be used within the spirit and meaning of the present invention as described herein.

Likewise, it is to be understood that control computer 160 can be any computing system comprising a processor and memory, including a personal computer, server, or other processing system, that runs software instructions for performing the described operations which instructions may themselves have come from or reside on a computer readable medium. Alternatively, control computer 160 can be any dedicated hardware such as an application specific integrated circuit (ASIC) or other hardwired device, with or without firmware, that is specifically configured to perform the described operations.

What is claimed is:

1. A method of laser wavelength control comprising:
making a prediction at first regular discrete intervals of a position of a prism position in a laser system;
receiving at second regular discrete intervals a measurement of an output wavelength of a master oscillator chamber in the laser system, the second regular discrete intervals being longer than the first regular discrete intervals;
wherein during each first regular discrete interval:
if the output wavelength measurement has not been received during the first regular discrete interval then computing in a control computer a control voltage for the prism using the predicted position of the prism,
if the output wavelength measurement has been received during the first regular discrete interval then updating the predicted position of the prism using the output wavelength measurement and computing in the control computer a control voltage for the prism using the updated predicted position of the prism,
and
outputting the computed control voltage from the control computer to electronics for positioning the prism.

2. The method of claim 1 wherein making the prediction at first regular discrete intervals of the position of the prism uses a model of the prism's movement.

3. The method of claim 2 wherein the model of the prism's movement is based on the prism's physical movement and disturbances within the laser system.

4. The method of claim 2 wherein the model in its integral form is:

$$x(t+T)=e^{AT}x(t)+\int_0^T e^{A\tau}Bu(T-\tau)d\tau,$$

wherein
$x(t+T)$ is the predicted state T-seconds before an initial state $x(t)$;
$e^{AT}$ is a state-transition matrix for a linear system;
B is an input matrix;
u is a value of a transducer signal; and
$\tau$ is a dummy variable.

5. The method of claim 1 wherein updating the predicted position of the prism using the output wavelength measurement uses the formula:

$$x(k|k)=(I-L_k C_k)X(k|k-1)+L_k y(k)$$

wherein
k indexes laser firing events;
I is an identity matrix of n rows by n columns wherein n is a number of elements in a state vector x;
$L_k$ is a gain matrix that captures a tradeoff between trusting new data and believing a previous prediction;
$C_k$ is a mapping from a predicted state to a predicted output;
$x(k|k)$ is an updated prediction given most recent data at index k; and
$x(k|k-1)$ is a non-updated prediction of the predicted state at laser firing index k given data from a previous laser firing event k−1.

6. A method of laser wavelength control comprising:
making a prediction at first regular discrete intervals of a position of a prism in a laser system;
receiving at second regular discrete intervals a measurement of an output wavelength of a master oscillator chamber in the laser system, the second regular discrete intervals being longer than the first regular discrete intervals;
wherein during each first regular discrete interval:
if the output wavelength measurement has not been received during the first regular discrete interval then computing in a control computer a control voltage for the prism using the predicted position of the prism,
if the output wavelength measurement has been received during the first regular discrete interval then
if the laser has fired again since receiving the output wavelength measurement then updating a previous prism position prediction using the output wavelength measurement, making a new prism position prediction based on the updated previous prism position prediction and computing in the control computer the control voltage for the prism using the new prism position prediction
and
if the laser has not fired again since receiving the output wavelength measurement then updating the predicted position of the prism using the output wavelength measurement and computing in the control computer the control voltage for the prism using the updated prism position prediction
and
outputting the computed control voltage from the control computer to electronics for positioning the prism.

7. The method of claim 6 wherein making the prediction at first regular discrete intervals of the position of the prism uses a model of the prism's movement.

8. The method of claim 7 wherein the model of the prism's movement is based on the prism's physical movement and disturbances within the laser system.

9. A prism controller method comprising:
predicting at first regular discrete intervals a position of a prism using a prism movement model;
receiving at second regular discrete intervals a measurement of the output wavelength of a master oscillator chamber controlled by the prism, the second regular discrete intervals being longer than the first regular discrete intervals;
wherein during each first regular discrete interval:
if the output wavelength measurement has not been received during the first regular discrete interval then computing a control voltage for the prism using the predicted position of the prism,
if the output wavelength measurement has been received during the first regular discrete interval then updating the predicted position of the prism using the output wavelength measurement and computing a control voltage for the prism using the updated predicted position of the prism,
and
outputting the computed control voltage to electronics for positioning the prism.

10. The method of claim 9 wherein making the prediction at first regular discrete intervals of the position of the prism uses a model of the prism's movement.

11. The method of claim 10 wherein the model of the prism's movement is based on the prism's physical movement and disturbances within the laser system.

12. The method of claim 10 wherein the model in its integral form is:

$$x(t+T) = e^{AT}x(t) + \int_O^T e^{A\tau} Bu(T-\tau)d\tau$$

wherein
$x(t+T)$ is the predicted state T-seconds before an initial state $x(t)$;
$e^{AT}$ is a state-transition matrix for a linear system;
B is an input matrix;
u is a value of a transducer signal; and
$\tau$ is a dummy variable.

13. The method of claim 9 wherein updating the predicted position of the prism using the output wavelength measurement uses the formula:

$$x(k|k) = (I - L_k C_k) X(k|k-1) + L_k y(k)$$

wherein
k indexes laser firing events;
I is an identity matrix of n rows by n columns wherein n is a number of elements in a state vector x;
$L_k$ is a gain matrix that captures a tradeoff between trusting new data and believing a previous prediction;
$C_k$ is a mapping from a predicted state to a predicted output;
$x(k|k)$ is an updated prediction, given most recent data at index k; and
$x(k|k-1)$ is a non-updated prediction of the predicted state at laser firing index k given data from a previous laser firing event k−1.

* * * * *